(12) United States Patent
Carey et al.

(10) Patent No.: US 7,957,106 B2
(45) Date of Patent: Jun. 7, 2011

(54) CHEMICALLY DISORDERED MATERIAL USED TO FORM A FREE LAYER OR A PINNED LAYER OF A MAGNETORESISTANCE (MR) READ ELEMENT

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 974 days.

(21) Appl. No.: 11/742,313

(22) Filed: Apr. 30, 2007

(65) Prior Publication Data
US 2008/0268290 A1 Oct. 30, 2008

(51) Int. Cl.
G11B 5/127 (2006.01)
G11B 5/33 (2006.01)
(52) U.S. Cl. .................................................. 360/324.1
(58) Field of Classification Search .................. 360/324, 360/324.1, 324.11, 324.12, 125.03–125.32
See application file for complete search history.

(56) References Cited

U.S. PATENT DOCUMENTS

| | | | |
|---|---|---|---|
| 5,793,279 A | 8/1998 | Nepela | |
| 6,876,522 B2 | 4/2005 | Ambrose et al. | |
| 6,977,801 B2 | 12/2005 | Carey et al. | |
| 2003/0116426 A1 | 6/2003 | Kim et al. | |
| 2004/0228046 A1 | 11/2004 | Hiramoto et al. | |
| 2005/0073778 A1 | 4/2005 | Hasegawa et al. | |
| 2005/0168882 A1 | 8/2005 | Kim et al. | |
| 2006/0044703 A1 | 3/2006 | Inomata et al. | |
| 2006/0188750 A1* | 8/2006 | Ide et al. | 428/812 |
| 2007/0121255 A1* | 5/2007 | Tsuchiya et al. | 360/324.1 |
| 2007/0230070 A1* | 10/2007 | Mizuno et al. | 360/324.12 |

FOREIGN PATENT DOCUMENTS

JP 2006161120 6/2006

OTHER PUBLICATIONS

Rajanikanth, A. et al., "Spin Polaraization of Co2MnGe and Co2MnSi Thin Films With A2 and L21 Structures", 17th International Conference on Magnetism (Aug. 2006).
Karthik, S. Vijay et al., "18th Magnetic Materials Center Seminar", (Jun. 5, 2006).
Yilgin, Resul et al., "Intrinsic Gilbert Damping Constant in Co2MnAl Heusler Alloy Films", IEEE Transactions on Magnetics, vol. 41, No. 10, pp. 2799-2801 (Oct. 2005).

(Continued)

Primary Examiner — Brian E Miller
Assistant Examiner — Adam B Dravininkas
(74) Attorney, Agent, or Firm — Duft Bornsen & Fishman, LLP

(57) ABSTRACT

Magnetoresistive (MR) read elements and associated methods of fabrication are disclosed. A free layer and/or a pinned layer of an MR read element are formed from a magnetic material such as $Co_{2-x-y}Mn_{1+x}Al_{1+y}$, $Co_{2-x-y}Mn_{1+x}Si_{1+y}$, $Co_{2-x-y}Mn_{1+x}Ge_{1+y}$, and $Co_{2-x-y}Fe_{1+x}Si_{1+y}$, where x and y are selected to create an off-stoichiometric alloy having a crystalline structure that is chemically disordered. The chemically disordered magnetic material has a lower spin-polarization than a Heusler alloy, but still exhibits acceptable GMR amplitudes and low spin-torque noise.

8 Claims, 3 Drawing Sheets

OTHER PUBLICATIONS

Sakuraba, Yuya et al., "Fabrication of Co2MnAl Heusler Alloy Epitaxial Film Using Cr Buffer Layer", Japanese Journal of Applied Physics, vol. 44, No. 9A, pp. 6535-6537 (2005).

Nakajima, K. et al, "Tunnel Magnetoresistance of Disordered, Low-Moment Co2MnSi Heusler Alloy Thin Films", Journal of Applied Physics 97 (2005).

Singh L. J. et al., "Structural and Transport Studies of Stoichiometric and Off-Stoichiometric Thin Films of the Full Heusler Alloy Co2MnSi", Journal of Applied Physics, vol. 95, No. 11, pp. 7231-7233 (Jun. 2004).

Gercsi, Z. et al., "Spin Polarization of Co2FeSi Full-Heusler Alloy and Tunneling Magnetoresistance of Its Magnetic Tunneling Junctions", Applied Physics Letters 89 (2006).

Singh L. J. et al., "Structural, Magnetic, and Transport Properties of Thin Films of the Heusler Alloy Co2MnSi", Applied Physics Letters, vol. 84, No. 13, pp. 2367-2369 (Mar. 2004).

Kubota, H. et al., "Fabrication and Characterization of Co-Mn-Al Heusler-Type Thin Film", Journal of Applied Physics 97 (2005).

Ming, Zhang et al., "The Structure, Magnetism, and Electrical-Transport Properties of Heusler Alloys Co2Cr1-xFexAl (x=0.2-0.6)", Journal of Applied Physics 97 (2005).

Okamura, S. et al., "Structural, Magnetic, and Transport Properties of Full-Heusler Alloy Co2 (Cr1-xFex)Al Thin Films", Journal of Applied Physics, vol. 96, No. 11, pp. 6561-6564 (Dec. 2004).

Miura, Yoshio et al., "Atomic Disorder Effects of Half-Metallicity of the Full-Heusler Alloys Co2(Cr1-xFex)Al: A First-Principal Study", Physical Review B 69 (2004).

* cited by examiner

US 7,957,106 B2

CHEMICALLY DISORDERED MATERIAL USED TO FORM A FREE LAYER OR A PINNED LAYER OF A MAGNETORESISTANCE (MR) READ ELEMENT

BACKGROUND OF THE INVENTION

1. Field of the Invention

The invention is related to the field of magnetoresistance (MR) elements and, in particular, to using a chemically disordered magnetic material to form a free layer and/or a pinned layer of an MR read element.

2. Statement of the Problem

Many computer systems use magnetic disk drives for mass storage of information. Magnetic disk drives typically include one or more recording heads (sometimes referred to as sliders) that include read elements and write elements. A suspension arm holds the recording head above a magnetic disk. When the magnetic disk rotates, an air flow generated by the rotation of the magnetic disk causes an air bearing surface (ABS) side of the recording head to ride at a particular height above the magnetic disk. The height depends on the shape of the ABS. As the recording head rides on the air bearing, an actuator moves an actuator arm that is connected to the suspension arm to position the read element and the write element over selected tracks of the magnetic disk.

As the read element passes over the bits and bit transitions recorded on tracks of the magnetic disk, the magnetic fields for the bits and bit transitions modulate the resistance of the read element. The change in resistance of the read element is detected by passing a sense current through the read element, and then measuring the change in bias voltage across the read element. The resulting read back signal is used to recover the data encoded on the track of the magnetic disk.

The most common type of read elements are magnetoresistance (MR) read elements. One type of MR read element is a Giant MR (GMR) read element. GMR read elements having two layers of ferromagnetic material (e.g., CoFe) separated by a nonmagnetic spacer layer (e.g., Cu) are generally referred to as spin valve (SV) elements. A simple-pinned SV read element generally includes an antiferromagnetic (AFM) pinning layer (e.g., PtMn), a ferromagnetic pinned layer (e.g., CoFe), a nonmagnetic spacer layer (e.g., Cu), and a ferromagnetic free layer (e.g., CoFe). The ferromagnetic pinned layer has its magnetization fixed by exchange coupling with the AFM pinning layer. The AFM pinning layer generally fixes the magnetic moment of the ferromagnetic pinned layer substantially perpendicular to the ABS of the recording head. Substantially perpendicular means closer to perpendicular than to parallel. The magnetization of the ferromagnetic free layer is not fixed and is free to rotate in response to an external magnetic field from the magnetic disk.

Another type of SV read element is an antiparallel (AP) pinned SV read element. The AP-pinned SV read element differs from the simple pinned SV read element in that an AP-pinned structure has multiple thin film layers forming the pinned layer structure instead of a single pinned layer. The pinned layer structure includes a first ferromagnetic pinned layer (e.g., CoFe), a nonmagnetic AP-coupling layer (e.g., Ru), and a second ferromagnetic reference layer (e.g., CoFe). The first ferromagnetic pinned layer has a magnetization oriented in a first direction substantially perpendicular to the ABS by exchange coupling with the AFM pinning layer. The second ferromagnetic reference layer is antiparallel coupled with the first ferromagnetic pinned layer across the AP coupling layer. Accordingly, the magnetization of the second ferromagnetic reference layer is oriented in a second direction that is generally antiparallel to the direction of the magnetization of the first ferromagnetic pinned layer.

It is desirable in a GMR read element to have high spin-polarization in the free layer and the pinned layer of a simple spin-valve or the free layer and the reference layer of an AP-pinned spin-valve to achieve high GMR amplitudes. The high GMR amplitudes produce a cleaner read back signal that is read from the magnetic disk. One problem with using CoFe or a similar material for the pinned layer and the free layer is that the spin-polarization may not be as high as desired. One solution to this problem is to replace the CoFe with another material having a higher spin-polarization.

One class of materials exhibiting 100% spin-polarization is half-metallic full Heusler alloys. Full Heusler alloys are defined as chemically ordered alloys that exhibit the chemical formula $X_2YZ$ and crystallize in the $L2_1$ structure. The $L2_1$ structure comprises a simple cubic lattice of X atoms. The Y and Z atoms are located in the alternating body-centered cubic sites of the simple cubic lattice of X atoms thus forming two interpenetrating face-centered cubic lattices. FIG. 1 illustrates an exemplary structure of an ordered Heusler alloy. Examples of half-metallic full Heusler alloys are $Co_2MnAl$, $Co_2MnSi$, $Co_2MnGe$, and $Co_2FeSi$. The full Heusler alloys yield high GMR amplitudes when used for the free layer and/or pinned layer of a simple spin-valve or the free layer and/or the reference layer of an AP-pinned spin-valve. One problem however with full Heusler alloys is that their high spin-polarization leads to high spin-torque noise because the current-density threshold for spin-torque is generally lower for higher spin-polarization alloys. The high spin-torque noise distorts the read back signal making this alloy undesirable for use as a free layer or a pinned layer. Thus, it is desirable to use a different type of material for the pinned layer and/or free layer of a GMR read element.

SUMMARY OF THE SOLUTION

The invention solves the above and other related problems by using a magnetic material for the free layer and the pinned layer of a simple spin-valve or the free layer and the reference layer of an AP-pinned spin-valve that has a chemical composition close to but not exactly that of a full Heusler alloy, and therefore exhibits some degree of chemical disorder. A chemically disordered crystalline structure exhibits a perturbation of the perfect crystalline order so that there is an element of randomness in the atomic positions. If alloys with chemical formula $Co_2MnAl$, $Co_2MnSi$, $Co_2MnGe$, or $Co_2FeSi$ are prepared as chemically disordered structures, such as by preparing them off-stoichiometry (thus as preparing $(Co_2Mn)_{1+x}Ge_{1+x}$ with x different from but close to zero), they will loose their half-metallic property which they would exhibit as full Heusler alloys ordered in the $L2_1$ structure. Accordingly, their spin-polarization is lower than 100% which leads to reduced corresponding spin-torque noise. However, their spin-polarization can still be high enough to exhibit GMR amplitudes that are higher than those produced with a CoFe or NiFe alloy traditionally used for a free layer or a pinned layer. An MR read element utilizing this type of free layer and/or pinned layer in a simple spin-valve or the free layer and/or the reference layer in an AP-pinned spin-valve can advantageously generate a clean read back signal due to the high GMR amplitudes and the lower spin-torque noise.

In one embodiment of the invention, a magnetoresistance (MR) read element comprises a ferromagnetic pinned layer structure, a nonmagnetic spacer layer, and a ferromagnetic free layer. One or both of the free layer and pinned layer structure is comprised of a magnetic material selected from the group consisting of chemically disordered $Co_{2-x-y}Mn_{1+x}Al_{1+y}$, $Co_{2-x-y}Mn_{1+x}Si_{1+y}$, $Co_{2-x-y}Mn_{1+x}Ge_{1+y}$, and $Co_{2-x-y}Fe_{1+x}Si_{1+y}$, where x and/or are selected to create an off-stoichiometric alloys. For instance, the value of at least one of x and y are in the range of −0.3 to 0.3 but not including zero.

As a result, these alloys have a lower spin-polarization than a Heusler alloy, but still exhibit acceptable GMR amplitudes. The MR read element in this embodiment can thus generate a clean read back signal due to the high GMR amplitudes and the lower spin-torque noise.

The invention may include other exemplary embodiments described below. For instance, additional embodiments may comprise methods of fabricating the read elements described above.

DESCRIPTION OF THE DRAWINGS

The same reference number represents the same element or same type of element on all drawings.

DETAILED DESCRIPTION OF THE INVENTION

FIGS. 2-5 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
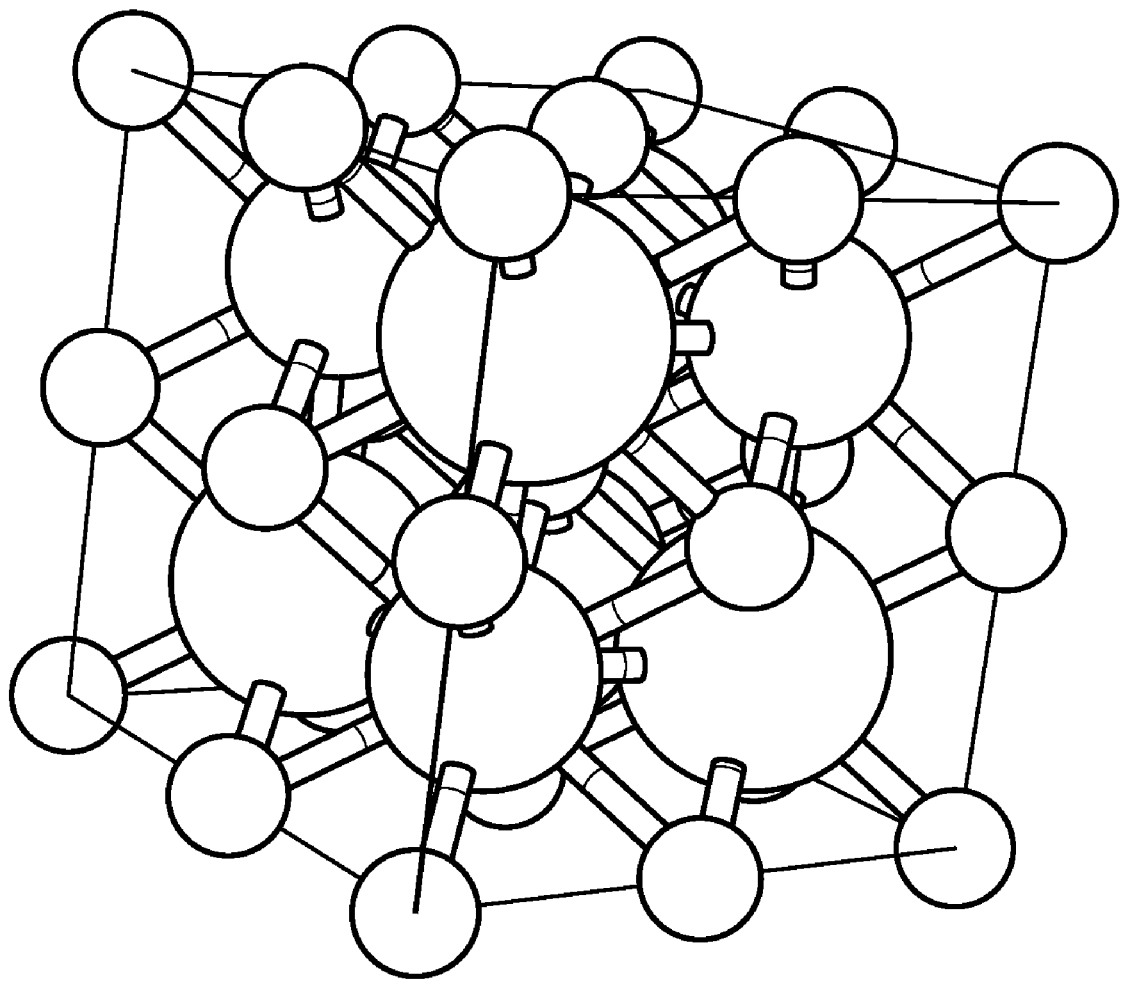
FIG. 1 illustrates the structure of an ordered Heusler alloy in the prior art.
Figure 2:
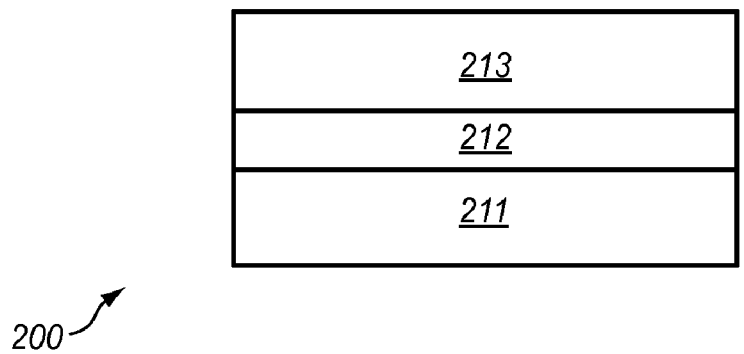
FIG. 2 illustrates a MR read element in an exemplary embodiment of the invention.

FIG. 2 illustrates a MR read element 200 in an exemplary embodiment of the invention. FIG. 2 is a view from the air bearing surface (ABS) of MR read element 200. MR element 200 includes a ferromagnetic pinned layer structure 211, a spacer layer 212, and a ferromagnetic free layer 213. Those skilled in the art understand that MR read element 200 may include other layers in other exemplary embodiments, such as pinning layers, seed layers, biasing layers, shields, etc. Pinned layer structure 211 may refer generally to a pinned layer of a simple spin-valve or a reference layer of an AP pinned spin-valve. MR read element 200 may comprise a giant magnetoresistance (GMR) read element operating in a current perpendicular to the plane (CPP) fashion.

Figure 3:
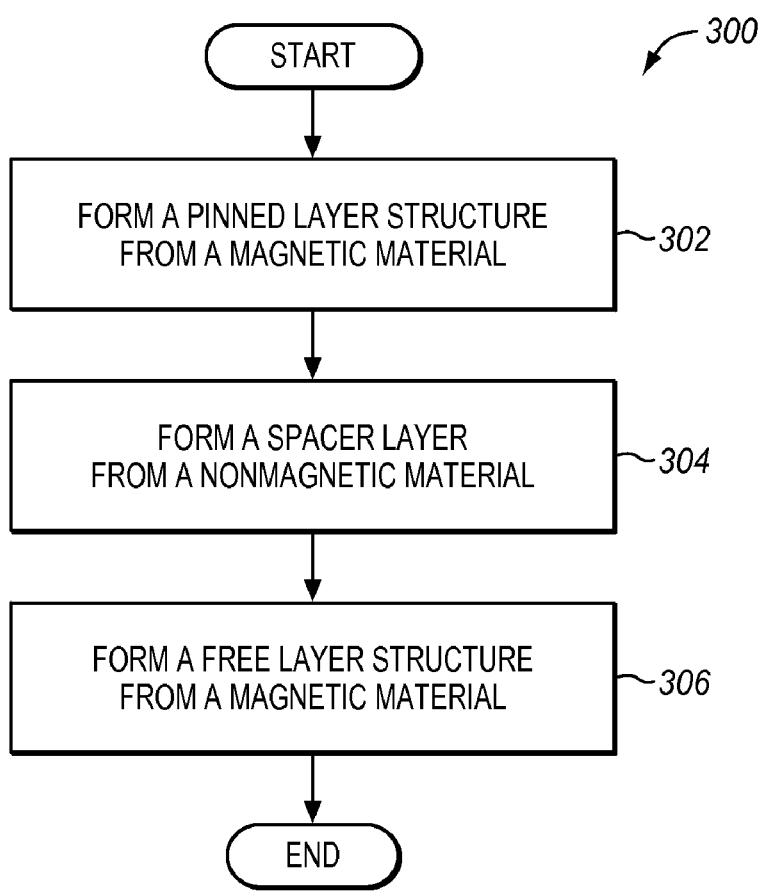
FIG. 3 is a flow chart illustrating a method of fabricating the MR read element shown in FIG. 2 in an exemplary embodiment.

FIG. 3 is a flow chart illustrating a method 300 of fabricating MR read element 200 shown in FIG. 2 in an exemplary embodiment. The steps of the flow chart in FIG. 3 are not all inclusive and may include other steps not shown. For instance, a shield may be formed or deposited on a substrate, one or more seed layers may be formed or deposited, an AFM pinning layer may be formed or deposited, etc.

In step 302, a ferromagnetic pinned layer structure 211 is formed from a magnetic material. Pinned layer structure 211 may comprise a simple pinned structure or an AP-pinned structure. In step 304, a spacer layer 212 is formed from a nonmagnetic material. Spacer layer 212 may be Cu or another type of nonmagnetic material. In step 306, a ferromagnetic free layer 213 is formed from a magnetic material. These layers may be formed in many desired ways through deposition and annealing.

According to the embodiments shown in FIGS. 2-3, pinned layer structure 211 and free layer 213 are both formed from magnetic material. The magnetic material for one or both of pinned layer structure 211 and free layer 213 are formed from a chemically disordered material of $Co_{2-x-y}Mn_{1+x}Al_{1+y}$, $Co_{2-x-y}Mn_{1+x}Si_{1+y}$, $Co_{2-x-y}Mn_{1+x}Ge_{1+y}$, or $Co_{2-x-y}Fe_{1+x}Si_{1+y}$, where x and/or y are selected to create an off-stoichiometric alloy. For instance, the value of at least one of x and y are in the range of −0.3 to 0.3 but not including zero. A chemically disordered crystalline structure exhibits a perturbation of the perfect crystalline order so that there is an element of randomness in the atomic positions. Various types of disorder exist. One type of perturbation of crystalline order is substitutional atomic site disorder. Substitutional atomic site disorder is induced, for example, if there is an excess of at least one species of atoms, such as in $(Co_2Mn)_{1-x}Ge_{1+x}$, where Ge atoms substitute for Mn and/or Co atoms thus generating some degree of chemical disorder. Thus, site disorder can be designed in contrast to other types of disorder such as vacancies or dislocations. These types of defects are always present in real materials and are hard to control.

If there is full chemical disorder among Y and Z atoms in a $X_2YZ$ alloy (i.e., Y and Z atoms randomly occupy the body-centered sites in the simple cubic lattice of X atoms), then the $X_2YZ$ alloy has a B2 structure (also known as CsCl structure). If there is full chemical disorder among X, Y, and Z atoms, then the $X_2YZ$ alloy has an A2 or body-centered cubic structure.

The magnetic materials for pinned layer structure 211 and/or free layer 213 may thus crystallize in a B2 structure, an A2 structure, or another type of crystalline structure that is chemically disordered as compared to a chemically ordered structure, such as a full Heusler alloy (which is an $L2_1$ structure). When the alloys of $Co_{2-x-y}Mn_{1+x}Al_{1+y}$, $Co_{2-x-y}Mn_{1+x}Si_{1+y}$, $Co_{2-x-y}Mn_{1+x}Ge_{1+y}$, or $Co_{2-x-y}Fe_{1+x}Si_{1+y}$ are off-stoichiometry (such as the value of at least one of x and y in the range of −0.3 to 0.3 but not including zero) and have a chemically disordered crystalline structure, the alloys have a lower spin-polarization than the full Heusler alloy, but still exhibit GMR amplitudes that are higher than those produced with a CoFe alloy traditionally used for a free layer or a pinned layer. Because the spin-polarization of the chemically disordered magnetic material is lower than a Heusler alloy, the corresponding spin-torque noise is also lower making it a good material to use for pinned layer structure 211 or free layer 213 in a MR read element.

Figure 4:
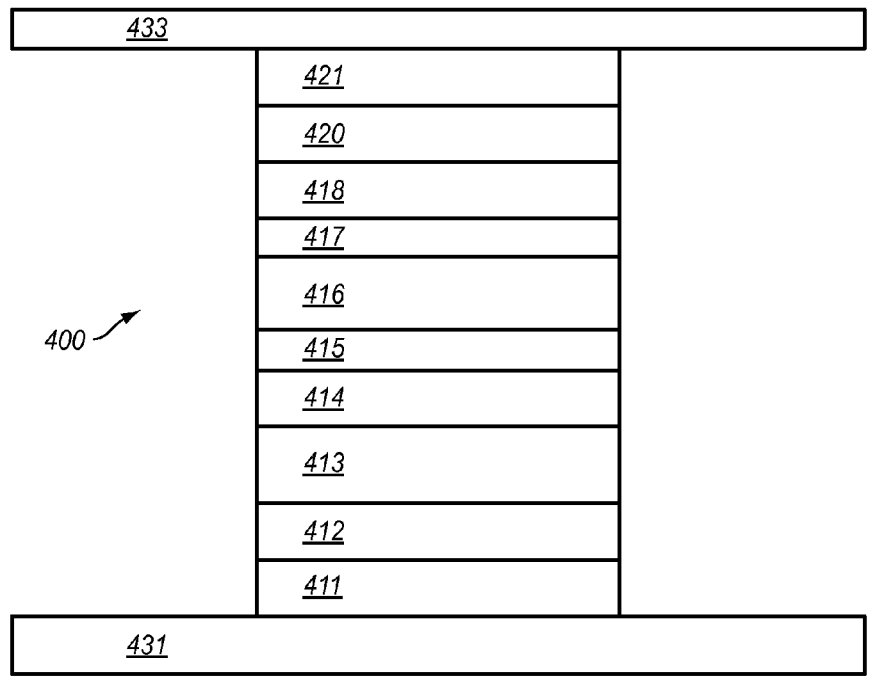
FIG. 4 illustrates a CPP GMR read element in another exemplary embodiment.

FIG. 4 illustrates a CPP GMR read element 400 in another exemplary embodiment. FIG. 4 is a view from the ABS of GMR read element 400. GMR read element 400 is a detailed embodiment that is in no way intended to limit the scope of the invention, as exemplary layers of GMR read element 400 are shown. Those skilled in the art understand that GMR read element 400 may include other layers in other exemplary embodiments.

In FIG. 4, GMR read element 400 is sandwiched between a first shield 431 and a second shield 433. The first shield 431 and the second shield 433 may be formed from NiFe or a similar material. GMR read element 400 includes a first seed layer 411 formed from Ta or a similar material, a second seed layer 412 formed from Ru or a similar material, and an antiferromagnetic (AFM) pinning layer 413. GMR read element 400 also includes a pinned layer structure comprising a ferromagnetic pinned layer 414 formed from CoFe, a nonmagnetic AP-coupling layer 415 formed from Ru, and a ferromagnetic reference layer 416. GMR read element 400 further includes a spacer layer 417 formed from Cu, a ferromagnetic free layer 418, a first cap layer 420 formed from Ru or a similar material, and a second cap layer 421 formed from Ta or a similar material. The materials given for the layers of GMR read element 400 are just examples and other materials may be used.

Exemplary thicknesses for the magnetic layers are about 10-100 Å, typically 30-50 Å. An exemplary thickness for spacer layer 417 is about 20-50 Å. An exemplary thickness for AP-coupling layer 415 is about 3-10 Å. An exemplary thickness for AFM pinning layer 413 is about 40-200 Å.

GMR read element 400 differs from prior GMR read elements in that one or both of reference layer 416 and/or free layer 418 is formed from an alloy having a chemically disordered crystalline structure. In particular, pinned (reference) layer 416 and/or free layer 418 may comprise $C_{2-x-y}Mn_{1+x}Al_{1+y}$, $Co_{2-x-y}Mn_{1+x}Si_{1+y}$, $Co_{2-x-y}Mn_{1+x}Ge_{1+y}$, or $Co_{2-x-y}Fe_{1+x}Si_{1+y}$ alloys that are purposely generated off-stoichiometry so that they have chemically disordered crystalline structures. For instance, the value of at least one of x and y are in the range of −0.3 to 0.3 but not including zero. To obtain strong AP-coupling, a layer of CoFe may be inserted between AP-coupling layer 415 and reference layer 416. GMR read element 400 thus generates high GMR amplitudes while having low spin-torque noise.

Figure 5:
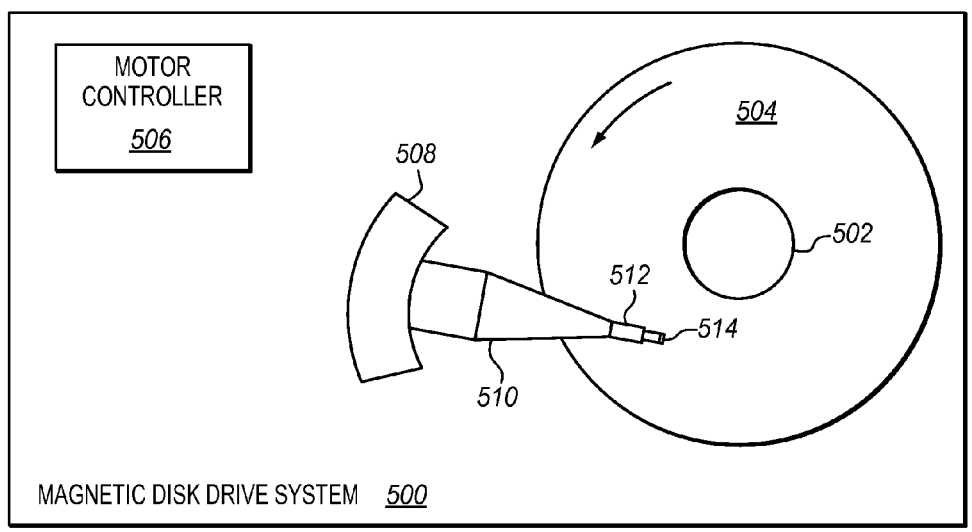
FIG. 5 illustrates a magnetic disk drive system in an exemplary embodiment.

The MR read elements shown in FIGS. 2 and 4 may be implemented in a magnetic disk drive system, or in other magnetic applications such as memories. FIG. 5 illustrates a magnetic disk drive system 500 in an exemplary embodiment. Magnetic disk drive system 500 includes a spindle 502, a magnetic recording medium 504, a motor controller 506, an actuator 508, an actuator arm 510, a suspension arm 512, and a recording head 514. Spindle 502 supports and rotates magnetic recording medium 504 in the direction indicated by the arrow. A spindle motor (not shown) rotates spindle 502 according to control signals from motor controller 506. Recording head 514 is supported by suspension arm 512 and actuator arm 510. Actuator arm 510 is connected to actuator 508 that is configured to rotate in order to position recording head 514 over a desired track of magnetic recording medium 504. Magnetic disk drive system 500 may include other devices, components, or systems not shown in FIG. 5. For instance, a plurality of magnetic disks, actuators, actuator arms, suspension arms, and recording heads may be used.

When magnetic recording medium 504 rotates, an air flow generated by the rotation of magnetic disk 504 causes an air bearing surface (ABS) of recording head 514 to ride on a cushion of air at a particular height above magnetic disk 504. The height depends on the shape of the ABS. As recording head 514 rides on the cushion of air, actuator 508 moves actuator arm 510 to position a read element (not shown) and a write element (not shown) in recording head 514 over selected tracks of magnetic recording medium 504. The read element in recording head 514 may comprise a MR element as described herein in the above FIGS.

Although specific embodiments were described herein, the scope of the invention is not limited to those specific embodiments. The scope of the invention is defined by the following claims and any equivalents thereof.

We claim:

1. A magnetoresistance (MR) read element, comprising:
   a ferromagnetic pinned layer structure;
   a nonmagnetic spacer layer; and
   a ferromagnetic free layer;
   wherein at least one of the pinned layer structure and the free layer is comprised of a magnetic material selected from the group consisting of $CO_{2-x-y}Mn_{1+x}Al_{1+y}$, $CO_{2-x-y}Mn_{1+x}Si_{1+y}$, $CO_{2-x-y}Mn_{1+x}Ge_{1+y}$, and $CO_{2-x-y}Fe_{1+x}Si_{1+y}$, where x and y are selected to create an off-stoichiometric alloy having a crystalline structure that is chemically disordered.

2. The MR read element of claim 1 wherein the magnetic material has a B2 crystalline structure.

3. The MR read element of claim 1 wherein the magnetic material has an A2 crystalline structure.

4. The MR read element of claim 1 wherein the value of at least one of x and y are in the range of −0.3 to 0.3 but not including zero.

5. A magnetic disk drive system, comprising:
   a magnetic disk; and
   a recording head including a magnetoresistive (MR) read element operable to read data from the magnetic disk, the MR read element comprising:
   a ferromagnetic pinned layer structure;
   a nonmagnetic spacer layer; and
   a ferromagnetic free layer;
   wherein at least one of the pinned layer structure and the free layer is comprised of a magnetic material selected from the group consisting of $CO_{2-x-y}Mn_{1+x}Al_{1+y}$, $CO_{2-x-y}Mn_{1+x}Si_{1+y}$, $CO_{2-x-y}Mn_{1+x}Ge_{1+y}$, and $CO_{2-x-y}Fe_{1+x}Si_{1+y}$, where x and y are selected to create an off-stoichiometric alloy having a crystalline structure that is chemically disordered.

6. The magnetic disk drive system of claim 5 wherein the magnetic material has a B2 crystalline structure.

7. The magnetic disk drive system of claim 5 wherein the magnetic material has an A2 crystalline structure.

8. The magnetic disk drive system of claim 5 wherein the value of at least one of x and y are in the range of −0.3 to 0.3 but not including zero.

* * * * *